United States Patent [19]
Pfizenmaier et al.

[11] Patent Number: 5,587,713
[45] Date of Patent: Dec. 24, 1996

[54] RADAR TRANSMITTER/RECEIVERS

[75] Inventors: Heinz Pfizenmaier, Leonberg, Germany; Philip Blakelock; Brian Prime, both of Lincoln, United Kingdom; David Dawson, Lincolnshire, United Kingdom

[73] Assignees: Plessey Semiconductors Limited, United Kingdom; Robert Bosch GmbH, Germany

[21] Appl. No.: 443,247

[22] Filed: May 17, 1995

[30] Foreign Application Priority Data

Jun. 1, 1994 [GB] United Kingdom ............... 9410985

[51] Int. Cl.⁶ .......................... G01S 13/93; G01S 7/28
[52] U.S. Cl. ...................... 342/70; 342/175; 455/327
[58] Field of Search ........................... 342/70, 71, 72, 342/175; 343/700 MS; 455/327

[56] References Cited

U.S. PATENT DOCUMENTS

| | | | |
|---|---|---|---|
| 3,870,960 | 3/1975 | Hallford et al. | 455/256 |
| 3,955,194 | 5/1976 | Chua | 333/11 X |
| 4,377,005 | 3/1983 | Marchand et al. | 455/327 |
| 4,492,960 | 1/1985 | Hislop | 333/109 X |

FOREIGN PATENT DOCUMENTS

| | | |
|---|---|---|
| 1448266 | 9/1976 | United Kingdom . |
| 2147150 | 5/1985 | United Kingdom . |
| 1605254 | 7/1986 | United Kingdom . |
| WO95/04943 | 2/1995 | WIPO . |

OTHER PUBLICATIONS

*Millimeter–Wave Components and Subsystems Built Using Microstrip Technology*, "8099 IEEE Transactions on Microwave Theory and Techniques", David A. Williams, 39, 1991 May, No. 5, New York, pp. 768–774.
*Unilateral Microstrip Balanced And Doubly Balanced Mixers*, 1989 IEEE MTT–S Digest, Reinhard Knochel, et al., Technische Universitat Hamburg–Harbutg, pp. 1247–1250.
*Up/Down Mixers For Satellite Communications Utilizing Rat–Race Circuits*, Makoto Hasegawa, et al., pp. 747–752.
*A Novel and Inexpensive Short Range FM–CW Radar Design*, Jurgen Kehrbeck, et al., IEE International Conference, Oct. 12–13, 1992, pp. 288–291, Abstract, p. 67.

Primary Examiner—John B. Sotomayor
Attorney, Agent, or Firm—Kirschstein, et al.

[57] ABSTRACT

A radar transmitter/receiver arrangement for use, for example, in automotive vehicle control in which R.F. energy from a frequency modulated oscillator is applied to an antenna for transmission and to one input of a mixer by way of a rat-race device, and RF energy reflected from a target and received at the antenna is applied to another input of the mixer by way of the rat-race device.

4 Claims, 1 Drawing Sheet

RADAR TRANSMITTER/RECEIVERS

BACKGROUND OF THE INVENTION

The present invention relates to radar transmitter/receivers for use for example in automotive vehicles.

Various types of distance measuring sensor are presently being considered for use in automotive safety programmes, the principle application being referred to as Autonomous Intelligent Cruise Control (AICC).

A vehicle equipped with conventional cruise control can be made to hold a road speed pre-selected by the driver until the brake pedal is operated, whereupon the vehicle reverts to normal operation. AICC enables a conventional vehicle cruise control function to be extended whereby the braking and throttle functions of cruise control operate without driver intervention. This function is achieved by the sensor on the AICC vehicle being able to determine the distance, lateral position across the carriageway and relative speed of nearby vehicles. Thus, a vehicle operating in autonomous cruise control mode can be automatically brought to a standstill if an object is detected in the path of the vehicle. The pre-selected cruise speed may be resumed once the object is no longer in the path of the AICC vehicle, giving the vehicle autonomous control in stop-go traffic.

One type of radar that is particularly suited to this application is frequency modulated continuous wave (FMCW), primarily because of its simplicity, potential low cost, and relative ease of subsequent signal processing.

In such a radar, a voltage controlled oscillator (VCO) is arranged to generate R.F. energy at nominally 76.5 GHz, which frequency may be varied over a range by applying a voltage ramp of known duration, giving a known frequency ramp rate. If this RF energy is then transmitted via an antenna to a reflective target, during the time taken for the energy to reach the target and return to the antenna the frequency of the VCO will have changed, and by mixing the reflected signal with the newly generated oscillator frequency used as the local oscillator (L.O.) drive to the mixer the distance-to-target can be calculated from the difference frequency.

In principle there may be two antennae, one for transmit and one for receive. In practice a single antenna is desirable to minimise size and cost, particularly for automotive use. In order to implement an FMCW radar in a single antenna (monostatic) form, it is normally the case that the transmit and receive functions are combined in at the antenna by means of a microwave circulator.

SUMMARY OF THE INVENTION

According to one aspect of the present invention in a radar transmitter/receiver arrangement output signals from an electric oscillator are arranged to be applied to an antenna and to a mixer, and signals received at said antenna are arranged to be applied to said mixer, by way of a dual rat-race device.

The rat-race device may comprise first, second, third and fourth ports spaced around a ring transmission path having a circumference of substantially one and a half wavelengths at the frequency of operation of the electric oscillator, the spacings between the first and second ports, the second and third ports and the third and fourth ports each being substantially one quarter of a wavelength and the spacing between the fourth and first ports being substantially three quarters of a wavelength at said frequency of operation. The second and third ports may be coupled to said electric oscillator and to said antenna respectively and said first and fourth ports may be coupled to respective inputs of said mixer.

BRIEF DESCRIPTION OF THE DRAWINGS

A radar transmitter/receiver arrangement in accordance with the present invention will now be described by way of example with reference to the accompanying drawing, of which.

DETAILED DESCRIPTION OF THE PREFERRED EMBODIMENT

Figure 1:
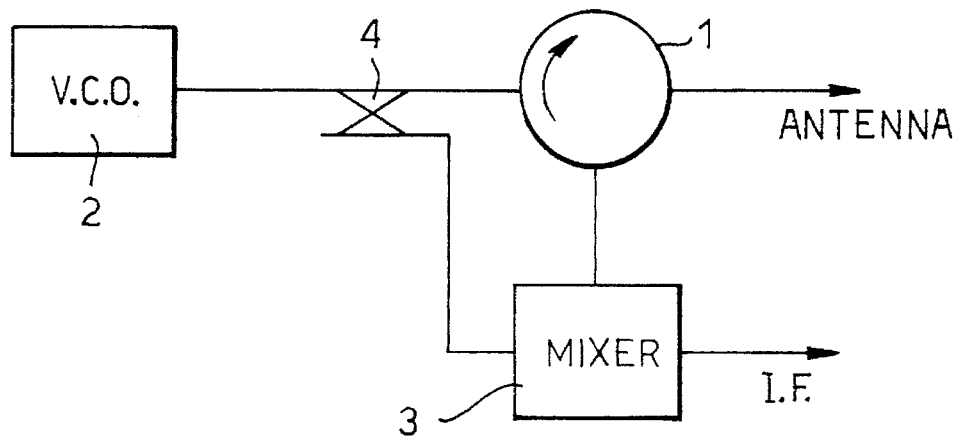
FIG. 1 shows schematically a known form of transmitter/receiver arrangement.

Referring first to FIG. 1, a circulator 1 ideally permits propagation of RF energy from an oscillator 2 only in the direction of the arrow, such that all the RF energy reaching the circulator 1 is transmitted from the antenna port. Similarly, RF energy reflected from a target and received by the antenna (not shown) will propagate only into a mixer 3. RF energy to act as the local oscillator signal for the mixer 3 is derived from the oscillator 2 by way of a directional coupler 4. As well as providing the local oscillator drive for the mixer 3, the coupler 4 also introduces losses and thereby degrades the transmit performance.

Imperfections in the circulator 1 occur in two areas, insertion loss and isolation. Imperfect isolation means that a proportion of the transmit power (typically −20 dB) enters the mixer receive port and a proportion of the reflected signal returns to the oscillator 2. Imperfect insertion loss means that approximately 0.8 dB loss occurs both during transmission to the antenna, and reception from the antenna. These factors degrade performance of a circulator based FMCW radar.

For automotive applications at millimetric frequencies, it is unlikely that this technique could be implemented in a sufficiently low cost manner.

Figure 2:
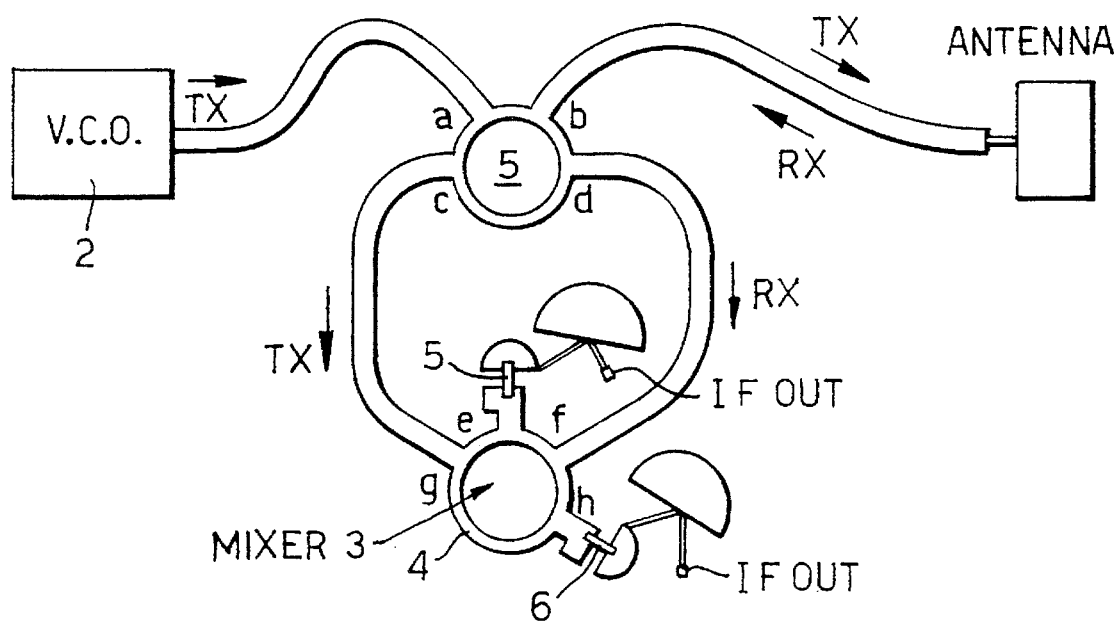
FIG. 2 shows a transmitter/receiver arrangement in accordance with the present invention.

The dual rat-race arrangement illustrated in FIG. 2 also facilitates transmission and reception via a single antenna, but in a cost effective manner.

The expensive circulator 1 is replaced by a 3 dB hybrid coupler or rat-race coupler 5, yet achieves the same functions. The hybrid coupler 5 can be realised on appropriate low cost microstrip media using photolithographic techniques, so that no additional cost is incurred over that of defining the main microstrip circuit.

The length of microstrip transmission line between each of the four ports is:

| | |
|---|---|
| port a to port b: | $\lambda/4$ |
| port b to port d: | $\lambda/4$ |
| port d to port c: | $3\lambda/4$ |
| port c to port a: | $\lambda/4$ | where $\lambda$ is the wavelength at −76.5 GHz

For an input at port a, power will propagate along the transmission line both clockwise and anti-clockwise. The two components of power arriving at port d will be in anti-phase and so in a perfect rat-race coupler, there will be no output power from port d. The two components of power arriving at port h and port c will be in phase so the power will be split equally into each port. Thus 50% of the oscillator power arrives at port c to provide L.O. drive to the mixer, and 50% is passed to the antenna through port b.

During reception, for a received signal arriving at port b from the antenna, there will be no output from c. The power will split equally into ports d and a. The power emerging from port a is considered to be wasted as it will only be down-converted if it reaches port d, this loss manifesting itself as increased conversion loss. Nevertheless, because both the circulator 1 and L.O. coupler 4, together with their associated insertion loss, are eliminated in this design, the overall performance of the two FMCW radars has been found to be comparable.

Transmitter power from the port c and received signal power from the port d are passed to respective ports g and f of a second rat-race coupler 4 which splits the incoming signal power at each port g and f 50:50 between mixer diodes 5 and 6, the transmitter power being applied in opposite phase and the received power being applied in the same phase to the two diodes.

The dual rat-race solution offers identical functionality to the circulator solution, yet it can be realised for a much lower cost than the conventional circulator. Comparative measured performance is summarised below:

|  | Circulator | Dual rat-race |
| --- | --- | --- |
| Transmission Loss | 6 dB | 6–7 dB |
| Conversion Loss | 9 dB | 12 dB |

It will be appreciated that compared to the simple conductor pattern of the microstrip rat-race, the previously proposed circulator arrangement requires an accurately machined hole or recess for a ferrite insert in the substrate on which the transmitter-receiver circuit is to be formed, the ferrite insert itself has to be accurately machined, and the electrical conductors of the circulator have to be accurately positioned with respect to the ferrite insert. These factors tend to slow the production rate and to cause higher reject rates than with the simple photolithographic processes for forming microstrip patterns.

At an operating frequency of 76.5 GHz a microstrip rat-race formed on a 125 micrometer thick quartz substrate, for example, may have a mean diameter of the order of 1 mm and be formed with conductors of the order of 0.2 mm wide. These dimensions would of course differ for other substrate materials, depending on the dielectric constant of the material.

We claim:

1. A frequency modulated, continuous wave, radar transmitter/receiver arrangement, comprising:

an electric oscillator; an antenna; mixer means; and dual rat-race coupling means including first and second ring transmission paths each having first, second, third and fourth ports, means coupling the second and third ports of the first ring transmission path to said oscillator and to said antenna respectively, means coupling the first and fourth ports of the first ring transmission path to the first and third ports of the second ring transmission path respectively, and means coupling at least one of the second and fourth ports of the second ring transmission path to said mixer means.

2. A frequency modulated, continuous wave, radar transmitter/receiver arrangement, comprising:

an electric oscillator having a nominal frequency of operation; an antenna; mixer means; and a dual rat-race coupling means including first and second ring transmission paths each having first, second, third and fourth ports and each having a circumference of substantially one and a half wavelengths at the nominal frequency of operation of said oscillator, the first and second ports, the second and third ports, and the third and fourth ports being spaced substantially one quarter of a wavelength apart at said frequency of operation, means coupling the second and third ports of the first ring transmission path to said oscillator and to said antenna respectively, means coupling the first and fourth ports of the first ring transmission path to the first and third ports of the second ring transmission path respectively, and means coupling the second and fourth ports of the second ring transmission path to said mixer means.

3. The radar transmitter/receiver arrangement in accordance with claim 2, wherein said mixer means includes first and second diodes coupled respectively to the second and fourth ports of the second ring transmission path.

4. The radar transmitter/receiver arrangement in accordance with claim 2, wherein the dual rat-race coupling means is formed as a microstrip pattern of conductors on an electrically insulating substrate.

* * * * *